United States Patent
Tomizawa et al.

(10) Patent No.: US 11,562,860 B2
(45) Date of Patent: Jan. 24, 2023

(54) MULTI-LAYER CERAMIC ELECTRONIC COMPONENT, METHOD OF PRODUCING THE SAME, AND CIRCUIT BOARD

(71) Applicant: Taiyo Yuden Co., Ltd., Tokyo (JP)

(72) Inventors: Yuji Tomizawa, Tokyo (JP); Wakae Akaishi, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 103 days.

(21) Appl. No.: 16/393,209

(22) Filed: Apr. 24, 2019

(65) Prior Publication Data
US 2019/0326061 A1    Oct. 24, 2019

(30) Foreign Application Priority Data
Apr. 24, 2018    (JP) .............................. JP2018-082861

(51) Int. Cl.
*H01G 4/30*    (2006.01)
*H01G 2/06*    (2006.01)
(Continued)

(52) U.S. Cl.
CPC ............... *H01G 4/30* (2013.01); *H01G 2/065* (2013.01); *H01G 4/005* (2013.01); *H01G 4/12* (2013.01);
(Continued)

(58) Field of Classification Search
CPC .......... H01G 4/005; H01G 2/065; H01G 4/30; H01G 4/232; H01G 2/02; H01G 4/12;
(Continued)

(56) References Cited

U.S. PATENT DOCUMENTS 6,414,835 B1 *   7/2002   Wolf .................... A61N 1/3754
                                                  361/306.3
8,468,664 B2 *   6/2013   Brendel ................... H01G 4/40
                                                    29/25.42
(Continued)

FOREIGN PATENT DOCUMENTS

JP            3-80514 A     4/1991
JP       2001-297944 A     10/2001
(Continued)

OTHER PUBLICATIONS

Office Action dated Dec. 8, 2021 in Japanese Application No. 2018-082861.

*Primary Examiner* — Arun Ramaswamy
(74) *Attorney, Agent, or Firm* — Saliwanchik, Lloyd & Eisenschenk

(57) ABSTRACT

A multi-layer ceramic electronic component includes a ceramic body and an external electrode. The ceramic body includes a first main surface and a second main surface that face in a first direction, internal electrodes laminated in the first direction, and a penetrating hole that has a diameter decreasing from the first main surface toward the second main surface and includes a tapered surface, the internal electrodes being exposed on the tapered surface. The external electrode includes a first conductive layer disposed along the tapered surface, and a second conductive layer disposed along the first main surface and connected to the first conductive layer.

16 Claims, 10 Drawing Sheets

(51) Int. Cl.
*H01G 4/005* (2006.01)
*H05K 1/18* (2006.01)
*H01G 4/12* (2006.01)

(52) U.S. Cl.
CPC ... *H05K 1/181* (2013.01); *H05K 2201/09572* (2013.01); *H05K 2201/10015* (2013.01)

(58) Field of Classification Search
CPC ......... H05K 1/181; H05K 2201/09572; H05K 2201/10015
USPC ......... 361/301.4, 321.1, 3, 21.2, 321.3, 302, 361/321.2, 306.3, 303
See application file for complete search history.

(56) References Cited

U.S. PATENT DOCUMENTS

| | | | | |
|---|---|---|---|---|
| 2003/0007310 A1* | 1/2003 | Trinh | ...................... | H01G 4/35 361/302 |
| 2006/0092595 A1* | 5/2006 | Hwa Lee | ................ | H01G 4/30 361/306.3 |
| 2008/0043400 A1* | 2/2008 | Fukudome | ........... | H05K 1/0231 361/301.4 |
| 2011/0004283 A1* | 1/2011 | Stevenson | ................ | H05K 9/00 607/116 |
| 2013/0048361 A1* | 2/2013 | Yamashita | ........ | H01L 23/49822 174/260 |
| 2013/0120901 A1* | 5/2013 | Masuda | .................. | H01G 4/018 361/303 |
| 2013/0184797 A1 | 7/2013 | Tang et al. | | |
| 2014/0185189 A1 | 7/2014 | Kim et al. | | |
| 2015/0134039 A1* | 5/2015 | Marzano | .................. | H02G 3/22 607/116 |
| 2016/0233025 A1* | 8/2016 | Masuda | .................... | H01G 4/06 |
| 2018/0068796 A1 | 3/2018 | Seo et al. | | |
| 2018/0144866 A1* | 5/2018 | Han | ....................... | H01G 4/232 |

FOREIGN PATENT DOCUMENTS

| | | |
|---|---|---|
| JP | 2006-179954 A | 7/2006 |
| JP | 2013-42083 A | 2/2013 |
| JP | 2014-130999 A | 7/2014 |

* cited by examiner

MULTI-LAYER CERAMIC ELECTRONIC COMPONENT, METHOD OF PRODUCING THE SAME, AND CIRCUIT BOARD

CROSS-REFERENCE TO RELATED APPLICATION

This application claims the benefit of Japanese Application No. 2018-082861, filed Apr. 24, 2018; which is hereby incorporated by reference in its entirety.

BACKGROUND

The present disclosure relates to a low-profile multi-layer ceramic electronic component, a method of producing the multi-layer ceramic electronic component, and a circuit board.

Representative multi-layer ceramic electronic components include multi-layer ceramic capacitors. Along with miniaturization, reduction in thickness, and achievement of high performance of electronic devices, there are demands for reduction in mount space in the multi-layer ceramic capacitors mounted to the electronic devices. Japanese Patent Application Laid-open No. 2014-130999 discloses a low-profile multi-layer ceramic capacitor.

SUMMARY

The multi-layer ceramic capacitor disclosed in Japanese Patent Application Laid-open No. 2014-130999 includes external electrodes that are soldered to a wiring board, and when solder spreads upward on the outer surface of each of the external electrodes, high bonding strength with respect to the wiring board is obtained. However, in this multi-layer ceramic capacitor, the solder protrudes to the outside of the external electrode, and thus a mount area on the wiring board is enlarged.

In view of the circumstances as described above, it is desirable to provide a multi-layer ceramic electronic component, a method of producing the multi-layer ceramic electronic component, and a circuit board that are capable of saving a mount space.

According to an embodiment of the present disclosure, there is provided a multi-layer ceramic electronic component including a ceramic body and an external electrode.

The ceramic body includes a first main surface and a second main surface that face in a first direction, internal electrodes laminated in the first direction, and a penetrating hole that has a diameter decreasing from the first main surface toward the second main surface and includes a tapered surface, the internal electrodes being exposed on the tapered surface.

The external electrode includes a first conductive layer disposed along the tapered surface, and a second conductive layer disposed along the first main surface and connected to the first conductive layer.

In the multi-layer ceramic electronic component, when the external electrode is soldered, the solder spreads upward along the first conductive layer from the second conductive layer and is drawn up into the penetrating hole. Accordingly, in the multi-layer ceramic electronic component, a large contact area of the solder to the external electrode can be ensured without causing the solder to protrude toward the outside.

Further, the diameter of the penetrating hole decreases from the first main surface toward the second main surface. In other words, since the diameter of the penetrating hole on the first main surface side is large, the solder easily enters the penetrating hole. Further, the solder that enters the penetrating hole from the first main surface side is drawn up by the capillary action more strongly as the solder comes closer to the second main surface. Accordingly, the solder suitably enters the penetrating hole.

The external electrode may include a first external electrode and a second external electrode.

The penetrating hole may include a plurality of penetrating holes provided to each of the first external electrode and the second external electrode.

In this configuration, since the contact area of the solder to the first external electrode and the second external electrode is enlarged by the action of the plurality of penetrating holes, equivalent series resonance (ESR) can be reduced.

The ceramic body may have a dimension in the first direction that is 200 µm or less.

In this configuration, a large contact area of the solder to the external electrode can be ensured by the action of the penetrating hole even in a low-profile multi-layer ceramic electronic component.

The external electrode may further include a third conductive layer that extends along the second main surface from the first conductive layer.

In this configuration, the solder overflowing from the penetrating hole to the second main surface spreads out on the third conductive layer. Accordingly, since the solder can be made flat on the second main surface, a mount space is less likely to be enlarged. Further, since the solder can be reliably caught by the third conductive layer, the solder can be inhibited from being mixed, as foreign substances, into the electronic device.

The ceramic body may have a dimension in a second direction orthogonal to the first direction, and have a dimension in a third direction orthogonal to the first direction and the second direction, the dimension in the third direction being smaller than the dimension in the second direction.

The external electrode may include a first external electrode and a second external electrode that are provided to both end portions in the second direction.

In this configuration, since the distance between the first external electrode and the second external electrode can be made short, the equivalent series inductance (ESL) can be reduced.

According to another embodiment of the present disclosure, there is provided a circuit board including: the multi-layer ceramic electronic component described above; and a wiring board that faces the first main surface, the external electrode being bonded to the wiring board by solder.

In this configuration, a mount space on the circuit board can be saved.

The solder may enter the penetrating hole.

In this configuration, the mount space on the circuit board can further be saved.

According to another embodiment of the present disclosure, there is provided a method of producing a multi-layer ceramic electronic component, the method including: producing an unsintered ceramic body including a first main surface and a second main surface that face in a first direction, and internal electrodes laminated in the first direction; sintering the ceramic body; forming a penetrating hole by irradiating the first main surface of the sintered ceramic body with short-pulse laser light, the penetrating hole having a diameter decreasing from the first main surface toward the second main surface and including a tapered surface, the internal electrodes being exposed on the tapered surface; and forming an external electrode including a conductive layer that extends over the tapered surface and the first main surface.

The short-pulse laser light includes one of pico-second laser light and femto-second laser light.

By this production method, the multi-layer ceramic electronic component having the configuration described above is obtained.

Further, in this configuration, using the short-pulse laser light allows the penetrating hole to be formed by ablation processing. Therefore, the ceramic body can be processed to have a more accurate shape while suppressing the influence of the heat applied to the ceramic body.

Furthermore, in this configuration, since the penetrating hole is formed in the ceramic body that becomes less deformable after the sintering, a minute penetrating hole can be formed.

In addition, in this configuration, the external electrode is connected to the internal electrodes exposed to the tapered surface of the penetrating hole that is formed after the sintering. Thus, the internal electrodes and the external electrode can be suitably connected to each other without receiving the influence of the heat applied to the ceramic body at the sintering.

The internal electrodes may not be exposed from the ceramic body at a time of sintering.

In this configuration, the internal electrodes can be inhibited from being oxidized at the sintering.

Sputtering may be performed on the ceramic body from the first main surface to form the external electrode.

In this configuration, since the tapered surface of the penetrating hole is widened toward the first main surface side, the external electrode including a conductive layer along the tapered surface can be suitably formed by sputtering performed from the first main surface side.

It is possible to provide a multi-layer ceramic electronic component, a method of producing the multi-layer ceramic electronic component, and a circuit board that are capable of saving a mount space.

These and other objects, features and advantages of the present disclosure will become more apparent in light of the following detailed description of embodiments thereof, as illustrated in the accompanying drawings.

DETAILED DESCRIPTION OF EMBODIMENTS

Hereinafter, an embodiment of the present disclosure will be described with reference to the drawings.

In the figures, an X axis, a Y axis, and a Z axis orthogonal to one another are shown as appropriate. The X axis, the Y axis, and the Z axis are common in all figures.

1. Configuration of Multi-Layer Ceramic Capacitor 10

Figure 1:
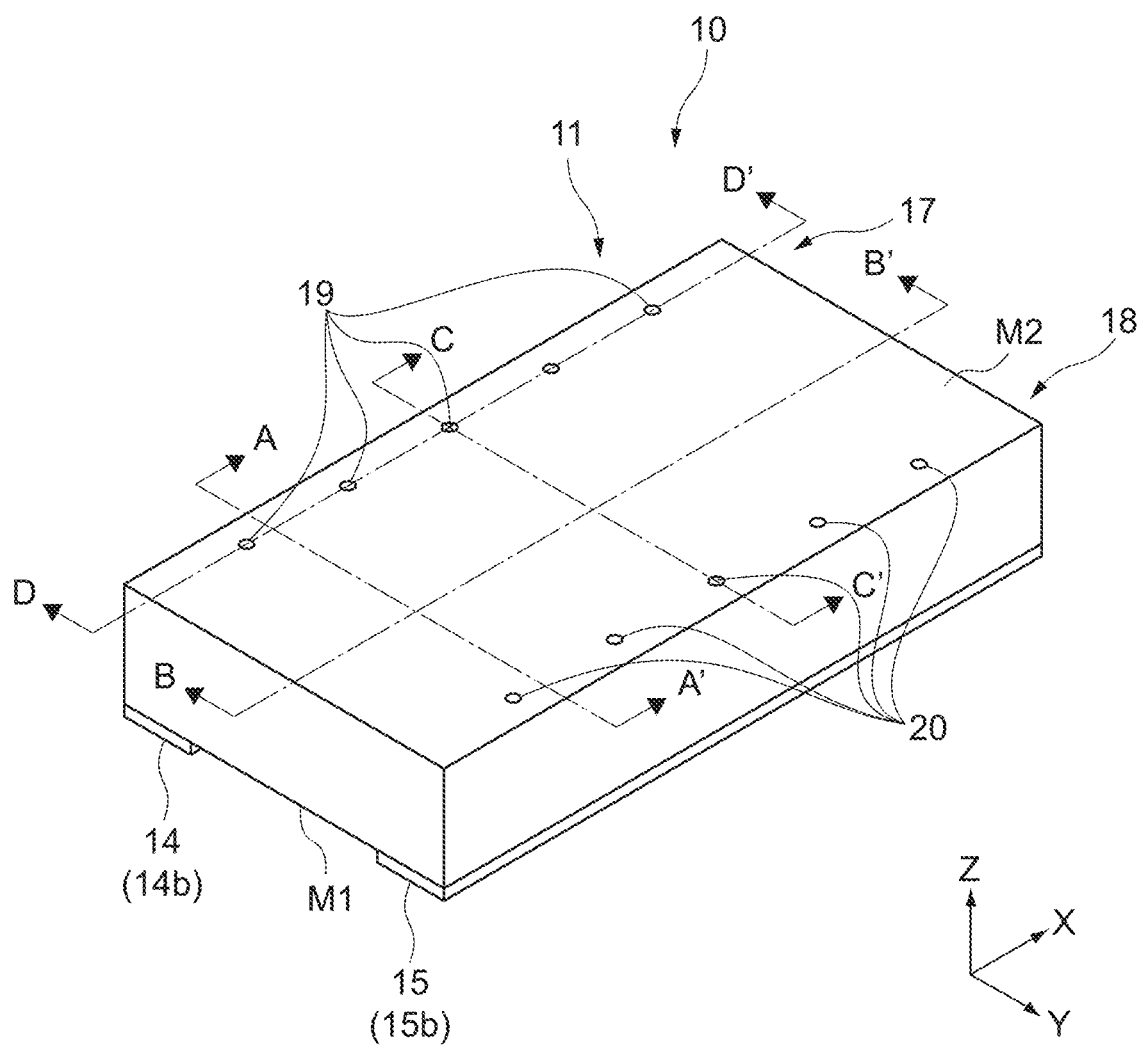
FIG. 1 is a perspective view of a multi-layer ceramic capacitor according to an embodiment of the present disclosure.
Figure 2:
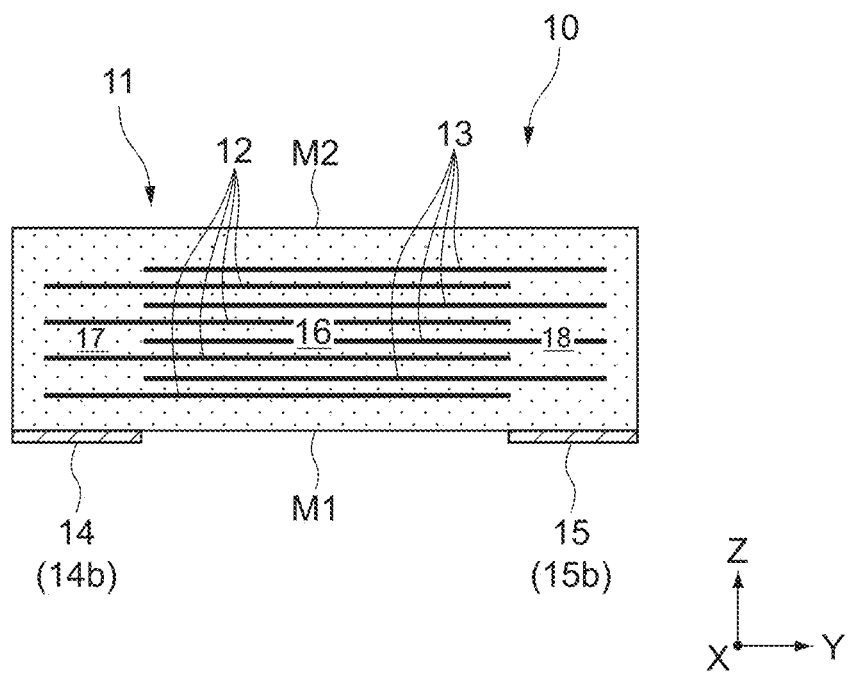
FIG. 2 is a cross-sectional view of the multi-layer ceramic capacitor taken along the A-A' line in FIG. 1.
Figure 3:
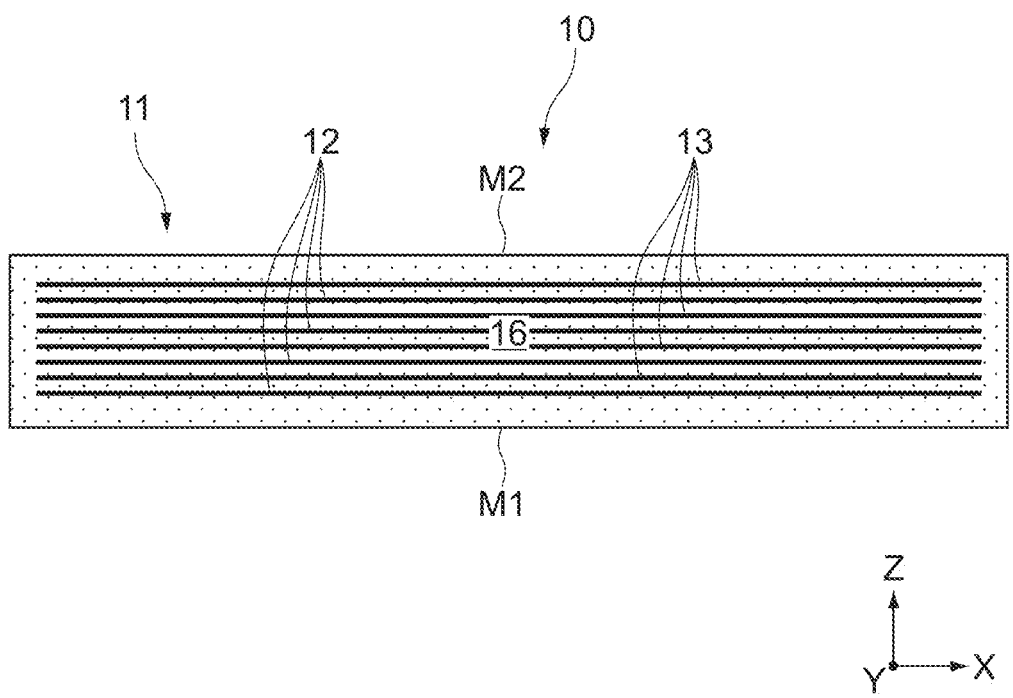
FIG. 3 is a cross-sectional view of the multi-layer ceramic capacitor taken along the B-B' line in FIG. 1.

FIGS. 1 to 3 each show a multi-layer ceramic capacitor 10 according to an embodiment of the present disclosure. FIG. 1 is a perspective view of the multi-layer ceramic capacitor 10. FIG. 2 is a cross-sectional view of the multi-layer ceramic capacitor 10 taken along the A-A' line in FIG. 1. FIG. 3 is a cross-sectional view of the multi-layer ceramic capacitor 10 taken along the B-B' line in FIG. 1.

The multi-layer ceramic capacitor 10 has a low-profile configuration in which the thickness (dimension in the Z-axis direction) is 200 µm or less. Further, in the multi-layer ceramic capacitor 10, for example, the dimension in a longitudinal direction (X-axis direction) can be set to 0.5 mm to 2.0 mm, and the dimension in a lateral direction (Y-axis direction) can be set to 0.2 mm to 1.0 mm.

More specifically, the size of the multi-layer ceramic capacitor 10 can be set to, for example, 0.6 mm×0.3 mm×50 µm, 1.0 mm×0.5 mm×80 µm, 1.6 mm×0.8 mm×100 µm, or the like. Of course, the multi-layer ceramic capacitor 10 can have various sizes other the sizes described above.

The multi-layer ceramic capacitor 10 includes a ceramic body 11, a first external electrode 14, and a second external electrode 15. The ceramic body 11 is configured as the main body of the multi-layer ceramic capacitor 10 and is formed to be long in the X-axis direction. Each of the first and second external electrodes 14 and 15 partially covers the surface of the ceramic body 11.

The ceramic body 11 has a hexahedral shape including a pair of side surfaces facing in the X-axis direction, a pair of end surfaces facing in the Y-axis direction, and a pair of a first main surface M1 and a second main surface M2 facing in the Z-axis direction. It should be noted that the ceramic body 11 does not need to strictly have a hexahedral shape. For example, the surfaces of the ceramic body 11 may be curved surfaces.

The ceramic body 11 includes a capacitance forming unit 16, a first end portion 17, and a second end portion 18. The capacitance forming unit 16 is disposed at the center of the ceramic body 11 in the Y-axis direction. The first and second end portions 17 and 18 are disposed on both sides of the capacitance forming unit 16 in the Y-axis direction in the ceramic body 11.

The ceramic body 11 includes a plurality of first internal electrodes 12 and a plurality of second internal electrodes 13. The first and second internal electrodes 12 and 13 each have a sheet-like shape extending along the X-Y plane. The first and second internal electrodes 12 and 13 are alternately disposed along the Z-axis direction. The first and second internal electrodes 12 and 13 are not exposed on any of the outer surfaces of the ceramic body 11.

The first internal electrodes 12 and the second internal electrodes 13 face each other in the Z-axis direction in the capacitance forming unit 16. The first internal electrodes 12 extend from the capacitance forming unit 16 to the first end portion 17 and are not disposed in the second end portion 18. The second internal electrodes 13 extend from the capacitance forming unit 16 to the second end portion 18 and are not disposed in the first end portion 17.

The first and second internal electrodes 12 and 13 are each made of a good conductor of electricity and function as internal electrodes of the multi-layer ceramic capacitor 10. Examples of the good conductor of electricity forming the first and second internal electrodes 12 and 13 include a metal or alloy mainly containing nickel (Ni), copper (Cu), palladium (Pd), platinum (Pt), silver (Ag), gold (Au), or the like.

In the ceramic body 11, in order to increase electrostatic capacitances of respective dielectric ceramic layers provided between the first internal electrodes 12 and the second internal electrodes 13, dielectric ceramics having a high dielectric constant is used. For the dielectric ceramics having a high dielectric constant, for example, a material having a Perovskite structure containing barium (Ba) and titanium (Ti), which is typified by barium titanate ($BaTiO_3$), is used.

It should be noted that the ceramic body 11 may be made of strontium titanate ($SrTiO_3$), calcium titanate ($CaTiO_3$), magnesium titanate ($MgTiO_3$), calcium zirconate ($CaZrO_3$), calcium zirconate titanate ($Ca(Zr,Ti)O_3$), barium zirconate ($BaZrO_3$), titanium oxide ($TiO_2$), or the like.

As shown in FIG. 1, the ceramic body 11 includes first penetrating holes 19 and second penetrating holes 20 that penetrate in the Z-axis direction. The first penetrating holes 19 are arrayed in the first end portion 17 along the X-axis direction. The second penetrating holes 20 are arrayed in the second end portion 18 along the X-axis direction. The first external electrode 14 and the second external electrode 15 are disposed at positions substantially corresponding to the first end portion 17 and the second end portion 18, respectively, on the first main surface M1.

Figure 4:
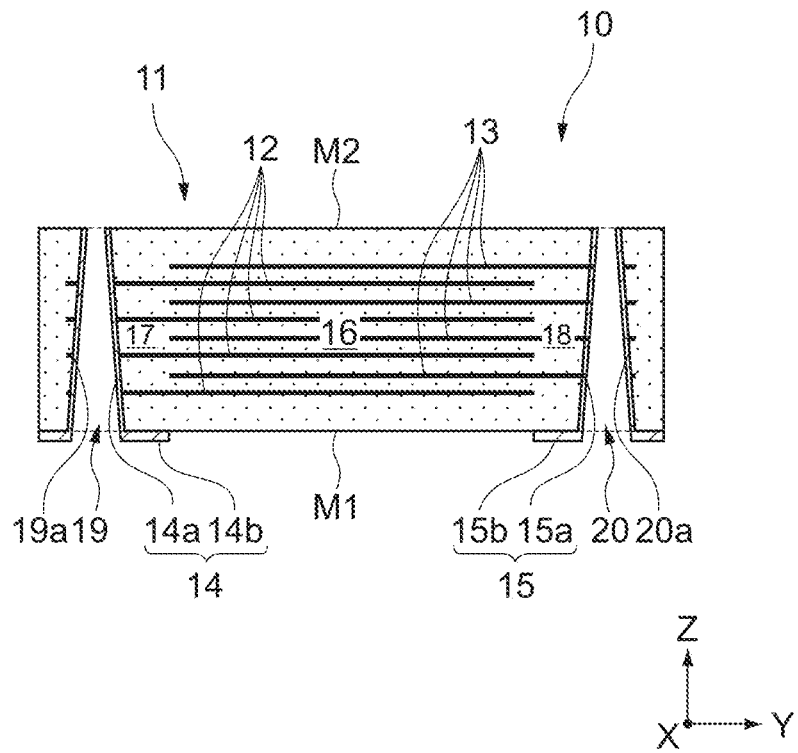
FIG. 4 is a cross-sectional view of the multi-layer ceramic capacitor taken along the C-C' line in FIG. 1.
Figure 5:
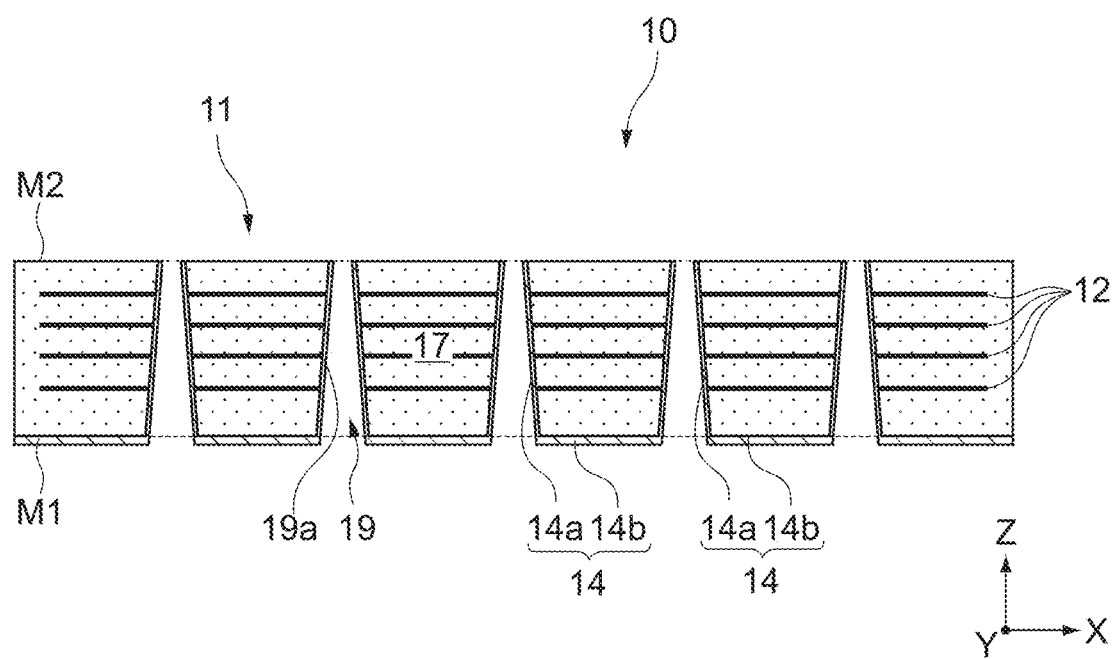
FIG. 5 is a cross-sectional view of the multi-layer ceramic capacitor taken along the D-D' line in FIG. 1.

FIG. 4 is a cross-sectional view of the multi-layer ceramic capacitor 10 taken along the C-C' line in FIG. 1. In other words, FIG. 4 shows a cross section at a position at which the first and second penetrating holes 19 and 20 are provided. FIG. 5 is a cross-sectional view of the multi-layer ceramic capacitor 10 taken along the D-D' line in FIG. 1. In other words, FIG. 5 shows a cross section of the first end portion 17.

The inner surfaces of the first and second penetrating holes 19 and 20 are respectively configured as tapered surfaces 19a and 20a and each have a diameter along the X-Y plane, which decreases from the first main surface M1 toward the second main surface M2. Each of the tapered surfaces 19a and 20a typically has a circular or elliptical shape along the X-Y plane, but the shape is not limited thereto and may be a polygonal shape, for example.

The first penetrating hole 19 penetrates the plurality of first internal electrodes 12. Thus, the first internal electrodes 12 are exposed on the tapered surface 19a of the first penetrating hole 19. Further, the second penetrating hole 20 penetrates the plurality of second internal electrodes 13. Thus, the second internal electrodes 13 are exposed on the tapered surface 20a of the second penetrating hole 20.

The first external electrode 14 includes a first conductive layer 14a and a second conductive layer 14b. The first conductive layer 14a is disposed along the tapered surface 19a of the first penetrating hole 19 and connects the plurality of first internal electrodes 12. The second conductive layer 14b is disposed in a region of the first end portion 17 on the first main surface M1 and connects all of the first conductive layers 14a in the X-axis direction.

The second external electrode 15 includes a first conductive layer 15a and a second conductive layer 15b. The first conductive layer 15a is disposed along the tapered surface 20a of the second penetrating hole 20 and connects the plurality of second internal electrodes 13. The second conductive layer 15b is disposed in a region of the second end portion 18 on the first main surface M1 and connects all of the first conductive layers 15a in the X-axis direction.

The first conductive layers 14a and 15a are formed to have a predetermined thickness along the tapered surfaces 19a and 20a, respectively. Thus, the first conductive layers 14a and 15a have tapered shapes corresponding to the tapered surfaces 19a and 20a, respectively, and form spaces penetrating the first and second end portions 17 and 18 in the Z-axis direction, respectively, without closing the first and second penetrating holes 19 and 20.

The first and second external electrodes 14 and 15 are each made of a good conductor of electricity and each function as a terminal of the multi-layer ceramic capacitor 10. Examples of the good conductor of electricity forming the first and second external electrodes 14 and 15 include a metal or alloy mainly containing nickel (Ni), copper (Cu), palladium (Pd), platinum (Pt), silver (Ag), gold (Au), or the like.

Further, each of the first and second external electrodes 14 and 15 may be formed as a multi-layer film. For example, each of the first and second external electrodes 14 and 15 can be a multi-layer film including a Cu layer, a Ni layer, and an Sn layer laminated in the stated order from the ceramic body 11 side. Further, for example, Ag, Ta, W, Cr, Pt, or Ti may be disposed as a contact metal for the ceramic body 11.

With such a condiguration, when a voltage is applied between the first external electrode 14 and the second external electrode 15 in the multi-layer ceramic capacitor 10, the voltage is applied to the plurality of dielectric ceramic layers provided between the first and second internal electrodes 12 and 13 in the capacitance forming unit 16. Thus, the multi-layer ceramic capacitor 10 stores charge corresponding to the voltage applied between the first external electrode 14 and the second external electrode 15.

In the multi-layer ceramic capacitor 10, since the first and second external electrodes 14 and 15 face each other in the Y-axis direction, which is the lateral direction of the ceramic body 11, the distance between the first and second external electrodes 14 and 15 can be made short. Accordingly, equivalent series inductance (ESL) can be reduced.

Further, in the multi-layer ceramic capacitor 10, since the first external electrode 14 includes the plurality of first conductive layers 14a and the second external electrode 15 includes the plurality of first conductive layers 15a, a contact area between the first external electrode 14 and the first internal electrodes 12 and a contact area between the second external electrode 15 and the second internal electrodes 13 are increased. Accordingly, the equivalent series resonance (ESR) can be reduced.

It should be noted that the configuration of the multi-layer ceramic capacitor 10 is not limited to a specific configuration, and a publicly known configuration can be employed as appropriate according to the size and performance expected for the multi-layer ceramic capacitor 10. For example, the number of first and second internal electrodes 12 and 13 and the thickness of each of the dielectric ceramic layers provided between the first and second internal electrodes 12 and 13 can be determined as appropriate.

2. Mounting of Multi-Layer Ceramic Capacitor 10

Figure 6A:
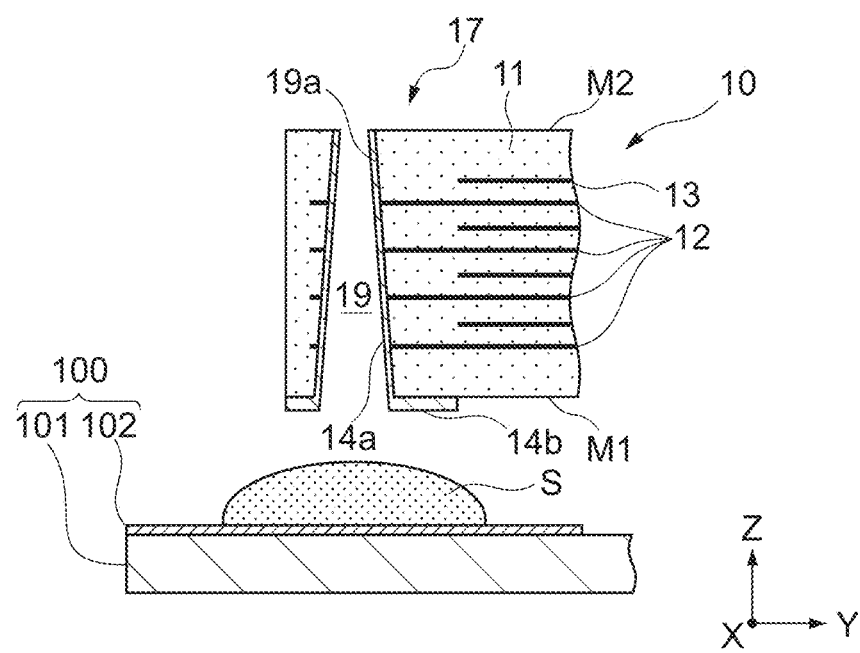
FIG. 6A is a partial cross-sectional view showing a state of the multi-layer ceramic capacitor at the mounting.
Figure 6B:
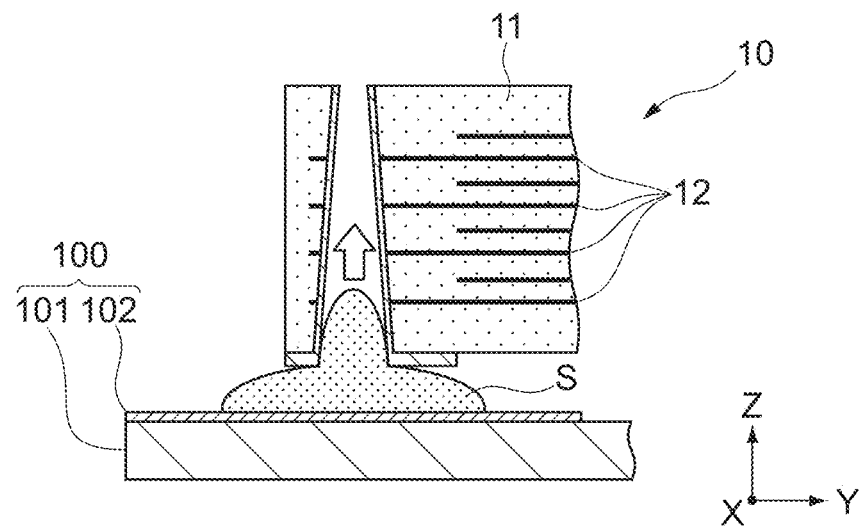
FIG. 6B is a partial cross-sectional view showing a state of the multi-layer ceramic capacitor at the mounting.
Figure 6C:
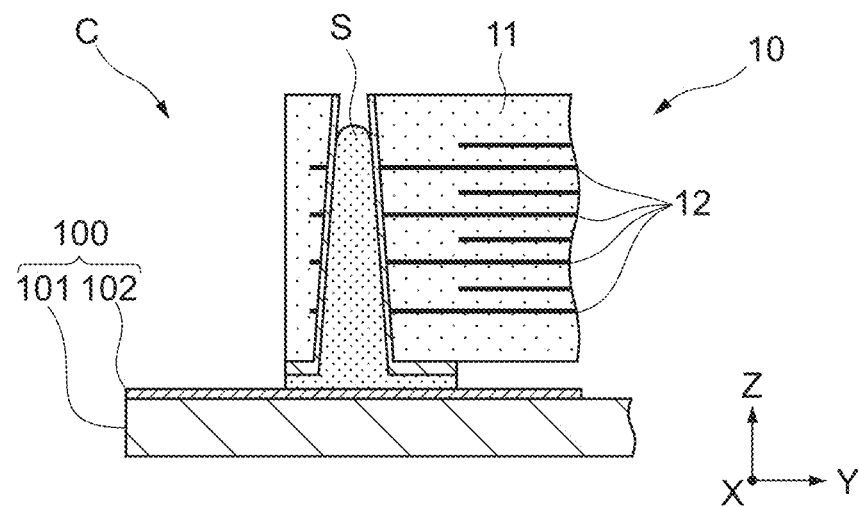
FIG. 6C is a partial cross-sectional view showing a state of the multi-layer ceramic capacitor at the mounting.

FIGS. 6A to 6C are partial cross-sectional views each showing a state of the multi-layer ceramic capacitor 10 at the mounting to a wiring board 100. More specifically, FIG. 6A to 6C each show a process of bonding the first and second external electrodes 14 and 15 of the multi-layer ceramic capacitor 10 to an electrode 102 by solder S, the electrode 102 being patterned on a base material 101 of the wiring board 100.

In the multi-layer ceramic capacitor 10, the first and second external electrodes 14 and 15 are bonded to the electrode 102 of the wiring board 100 via the solder S. It should be noted that FIG. 6A to 6C show only the first external electrode 14 of the first end portion 17, but the second external electrode 15 of the second end portion 18 is also in a similar state.

First, as shown in FIG. 6A, the solder S is provided on the electrode 102 of the wiring board 100, and the second conductive layers 14b and 15b of the first and second external electrodes 14 and 15 are disposed on the solder S. When the solder S is melted in a reflow oven or the like in the state where the second conductive layers 14b and 15b of the first and second external electrodes 14 and 15 are disposed on the solder S, the solder S spreads out to the first and second external electrodes 14 and 15.

At that time, as shown in FIG. 6B, the solder S is drawn up by a capillary action upward in the Z-axis direction within the first and second penetrating holes 19 and 20 along the first conductive layers 14a and 15a, respectively. Accordingly, as shown in FIG. 6C, the solder S enters the first and second penetrating holes 19 and 20. When the solder S is solidified, a circuit board C is obtained.

In the multi-layer ceramic capacitor 10, the tapered surfaces 19a and 20a of the first and second penetrating holes 19 and 20 each have a shape that allows the solder S to be easily introduced into the first and second penetrating holes 19 and 20 in the following points. First, the first point is that each of the first and second penetrating holes 19 and 20 is largely opened on the first main surface M1 side. Thus, the solder S can smoothly go into the first and second penetrating holes 19 and 20.

The second point is that each of the first and second penetrating holes 19 and 20 has a diameter decreasing upward in the Z-axis direction, that is, has a narrow flow path for the solder S. Thus, a force at which the solder S within the first and second penetrating holes 19 and 20 is drawn up by the capillary action increases as the solder S goes upward in the Z-axis direction. Accordingly, the solder S is smoothly drawn up within the first and second penetrating holes 19 and 20.

Figure 7A:
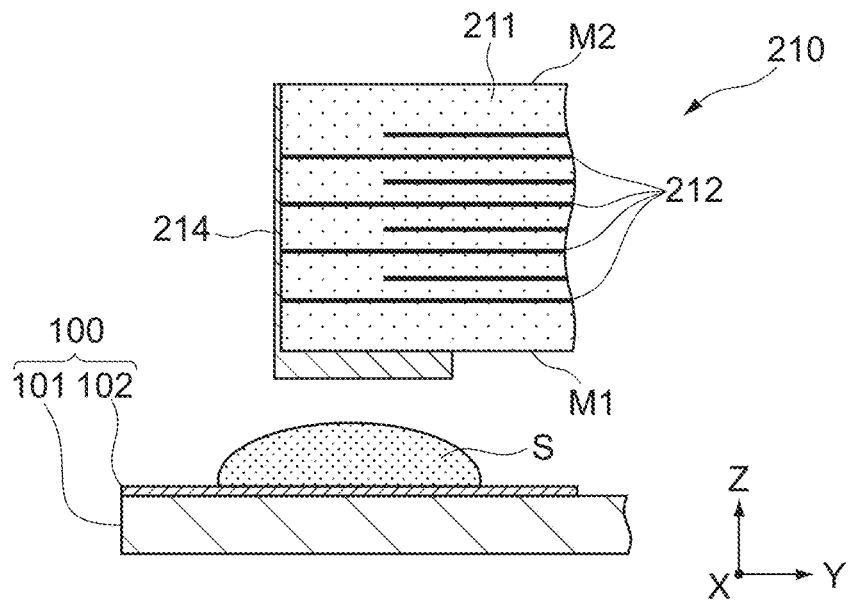
FIG. 7A is a partial cross-sectional view showing a state of a multi-layer ceramic capacitor of Comparative example at the mounting.
Figure 7B:
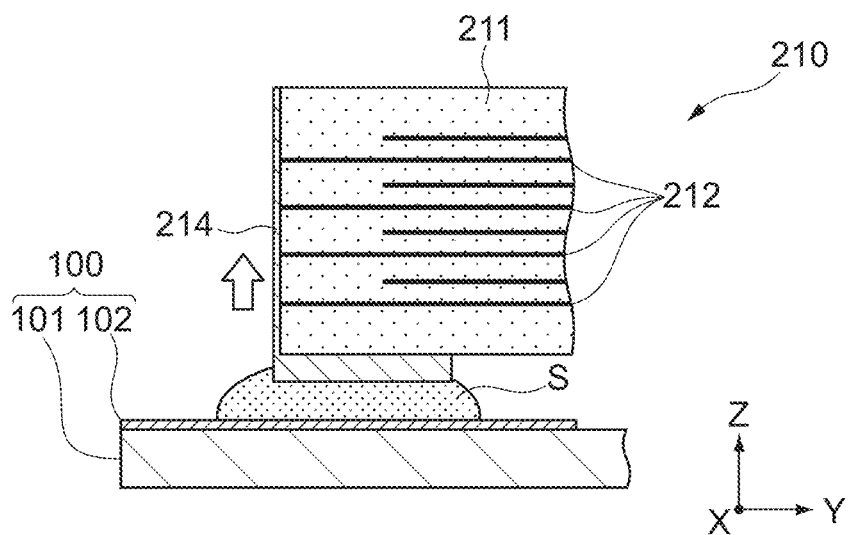
FIG. 7B is a partial cross-sectional view showing a state of the multi-layer ceramic capacitor of Comparative example at the mounting.
Figure 7C:
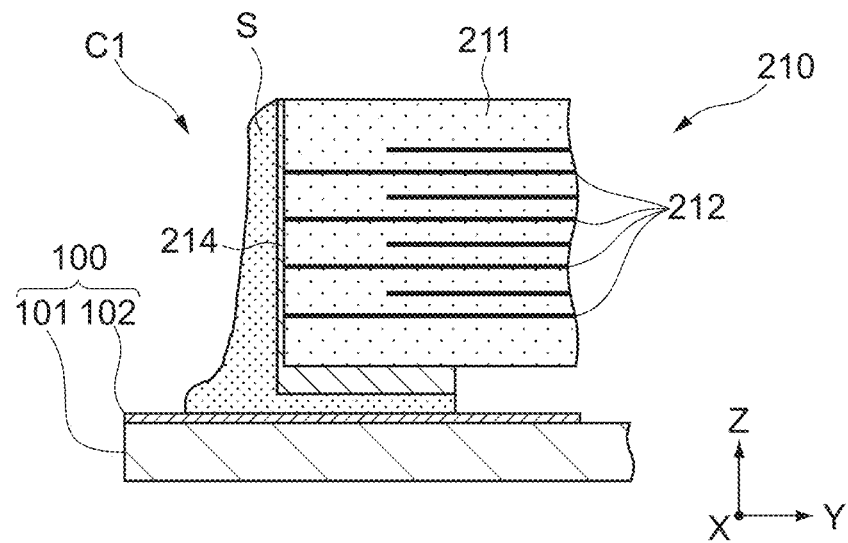
FIG. 7C is a partial cross-sectional view showing a state of the multi-layer ceramic capacitor of Comparative example at the mounting.

FIGS. 7A to 7C are partial cross-sectional views each showing a state of a multi-layer ceramic capacitor 210 according to Comparative example at the mounting to the wiring board 100. More specifically, FIGS. 7A to 7C each show a process of bonding the multi-layer ceramic capacitor 210 to the electrode 102 by the solder S, the electrode 102 being patterned on the base material 101 of the wiring board 100.

The multi-layer ceramic capacitor 210 according to Comparative example is different from the multi-layer ceramic capacitor 10 according to this embodiment in that a ceramic body 211 does not include penetrating holes and includes an L-shaped external electrode 214 that extends from the first main surface M1 of the ceramic body 211 to its end surface facing in the Y-axis direction.

In the multi-layer ceramic capacitor 210, first, as shown in FIG. 7A, the solder S is provided on the electrode 102 of the wiring board 100, and the external electrode 214 is disposed on the solder S. When the solder S is melted in a reflow oven or the like in the state where the external electrode 214 is disposed on the solder S, the solder S spreads out along the external electrode 214.

At that time, as shown in FIG. 7B, the solder S spreads upward in the Z-axis direction along the end surface, which faces in the Y-axis direction, of the ceramic body 211 including the external electrode 214. Subsequently, as shown in FIG. 7C, when the solder S that has reached the upper portion of the external electrode 214 in the Z-axis direction is solidified, a circuit board C1 according to Comparative example is obtained.

As shown in FIG. 7C, in the multi-layer ceramic capacitor 210 mounted to the circuit board C1, the solder S largely protrudes outward in the Y-axis direction. Thus, in the multi-layer ceramic capacitor 210, it is necessary to separately ensure a region for providing the solder S on the wiring board 100. This increases a mount area.

In this regard, in the multi-layer ceramic capacitor 10 according to this embodiment, when the solder S is provided within the first and second penetrating holes 19 and 20, a large contact area of the first and second external electrodes 14 and 15 with the solder S can be ensured without causing the solder S to protrude outward. Thus, it is unnecessary to separately ensure a region for the solder S on the wiring board 100.

Therefore, in the multi-layer ceramic capacitor 10, the mount space on the circuit board C can be saved. Thus, the use of the multi-layer ceramic capacitor 10 allows the miniaturization of the circuit board C and also provides an advantage for high-density mounting on the circuit board C.

It should be noted that the configuration such as the number or the size of the first and second penetrating holes 19 and 20, to which the first conductive layers 14a and 15a of the first and second external electrodes 14 and 15 are respectively provided, is not limited to the configuration shown in FIG. 1 or the like, and can be determined as appropriate in terms of the bonding strength between the first and second external electrodes 14 and 15 and the solder S, the mechanical strength of the multi-layer ceramic capacitor 10 itself, or the like.

3. Modified Examples of Multi-Layer Ceramic Capacitor 10

The configuration of the multi-layer ceramic capacitor 10 according to this embodiment is not limited to the above configuration and can be modified as needed. For example, in the multi-layer ceramic capacitor 10, the configuration of the first and second external electrodes 14 and 15 can be modified as appropriate. Hereinafter, a modified example of the first and second external electrodes 14 and 15 will be described.

As in the configuration shown in FIG. 7A or the like, each of the first and second external electrodes 14 and 15 may have a conductive layer that extends from each of the second conductive layers 14b and 15b along the end surfaces of the ceramic body 11 that face in the Y-axis direction. Also in this case, in the multi-layer ceramic capacitor 10, the protrusion of the solder S in the Y-axis direction can be suppressed by a portion of the solder S that is drawn up into the first and second penetrating holes 19 and 20.

Figure 8:
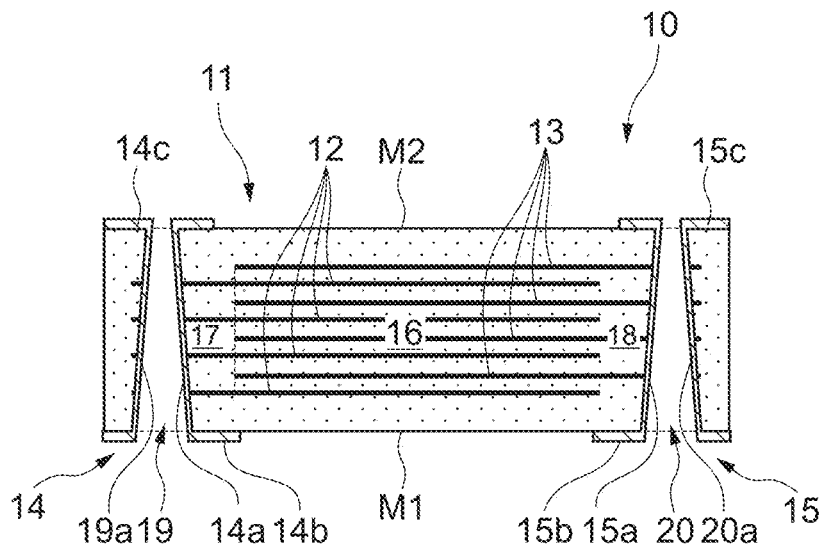
FIG. 8 is a cross-sectional view of a multi-layer ceramic capacitor of a modified example.

Further, as shown in FIG. 8, the first external electrode 14 may include a third conductive layer 14c that extends from the first conductive layer 14a to the circumference of the first penetrating hole 19 along the second main surface M2 of the ceramic body 11, and the second external electrode 15 may include a third conductive layer 15c that extends from the first conductive layer 15a to the circumference of the second penetrating hole 20 along the second main surface M2 of the ceramic body 11. The action of the third conductive layers 14c and 15c can inhibit a failure from occurring due to the solder S overflowing from the first and second penetrating holes 19 and 20 to the second main surface M2 of the ceramic body 11.

Figure 9:
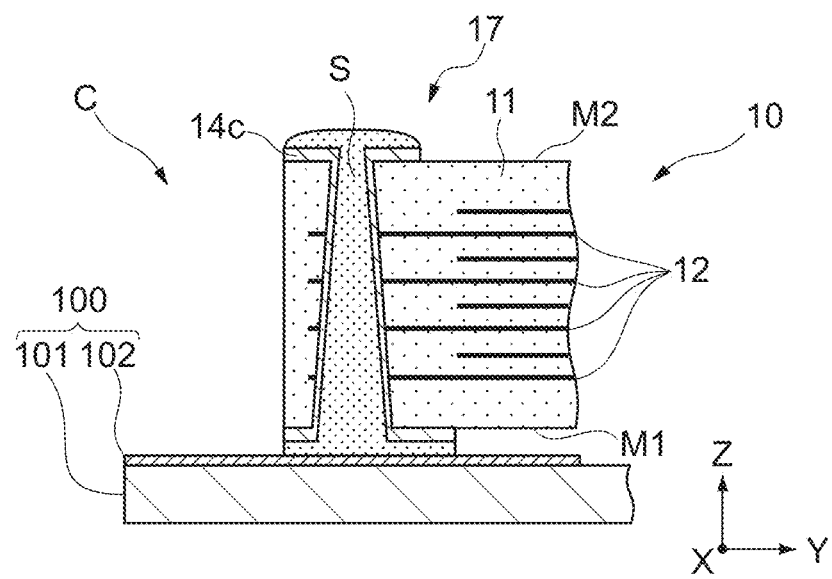
FIG. 9 is a partial cross-sectional view showing a state of the multi-layer ceramic capacitor of the modified example at the mounting.

In other words, as shown in FIG. 9, the solder S overflowing from the first and second penetrating holes 19 and 20 spreads out to the third conductive layers 14c and 15c. Accordingly, on the second main surface M2 of the ceramic body 11, the solder S can be made flat without being caused to protrude in the Z-axis direction. Thus, a mount space is less likely to be enlarged in the multi-layer ceramic capacitor 10.

Further, the solder S overflowing from the first and second penetrating holes 19 and 20 is reliably caught by the third conductive layers 14c and 15c. Thus, in the multi-layer ceramic capacitor 10, the solder S overflowing from the first and second penetrating holes 19 and 20 can be inhibited from being mixed, as conductive foreign substances, to the circuit board C or an electronic device equipped therewith.

Figure 10:
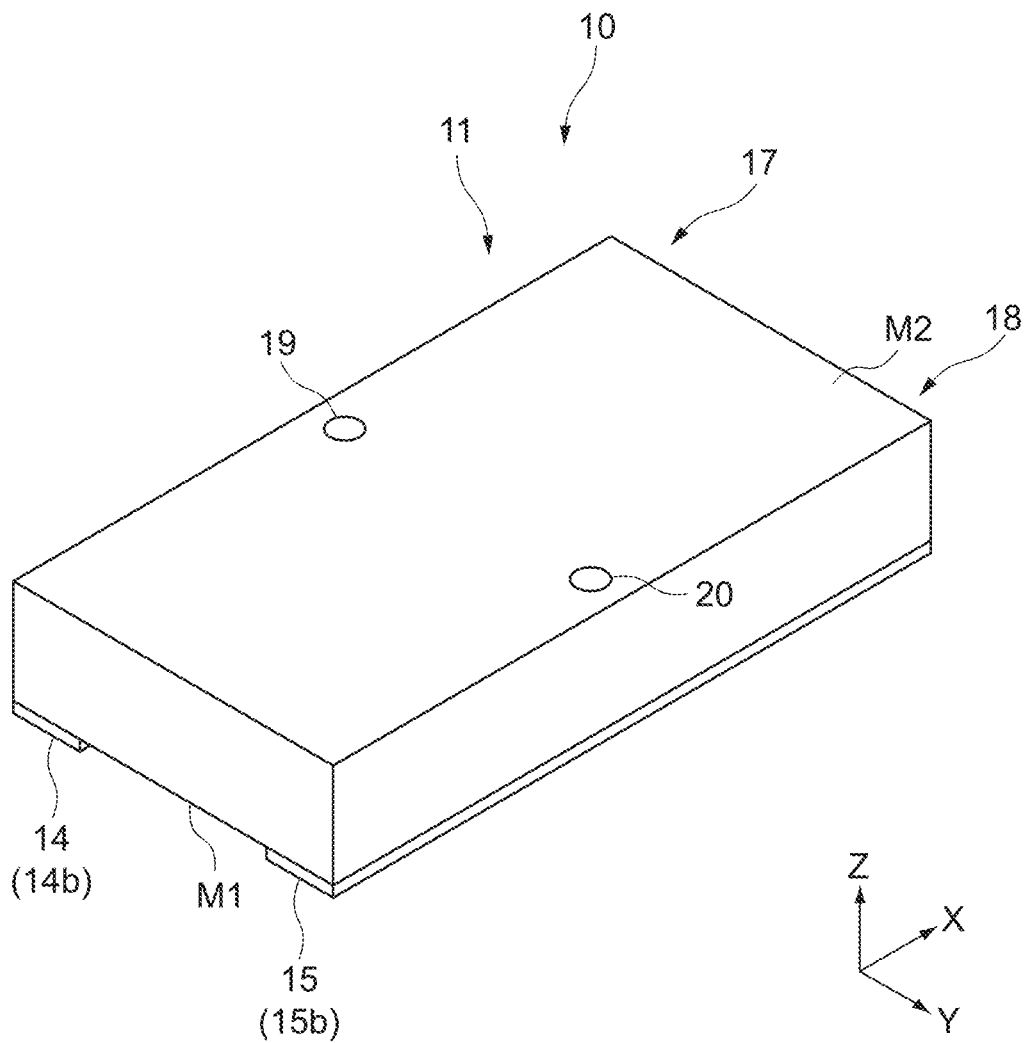
FIG. 10 is a perspective view of the multi-layer ceramic capacitor of a modified example.

Furthermore, the multi-layer ceramic capacitor 10 does not need to have the configuration including the plurality of first and second penetrating holes 19 and 20 and, as shown in FIG. 10, may have a configuration in which the single first penetrating hole 19 and the singe second penetrating hole 20 are provided. In this case, the positions of the first and second penetrating holes 19 and 20 can be optionally determined, and the shapes of the first and second penetrating holes 19 and 20 can also be optionally determined.

4. Method of Producing Multi-Layer Ceramic Capacitor 10

Figure 11:
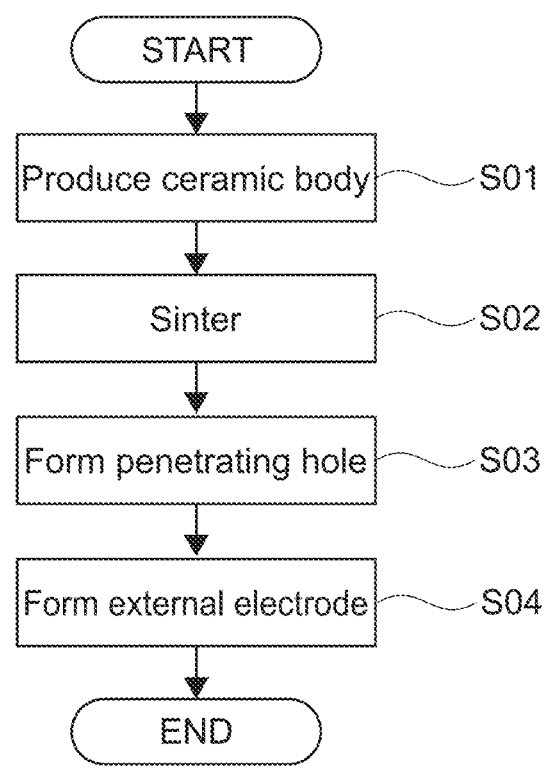
FIG. 11 is a flowchart showing a method of producing the multi-layer ceramic capacitor.

FIG. 11 is a view showing a production process of the multi-layer ceramic capacitor 10. Hereinafter, the method of producing the multi-layer ceramic capacitor 10 will be described according to FIG. 11 with reference to FIGS. 12 and 13 as appropriate.

4.1 Step S01: Production of Ceramic Body

Figure 12:
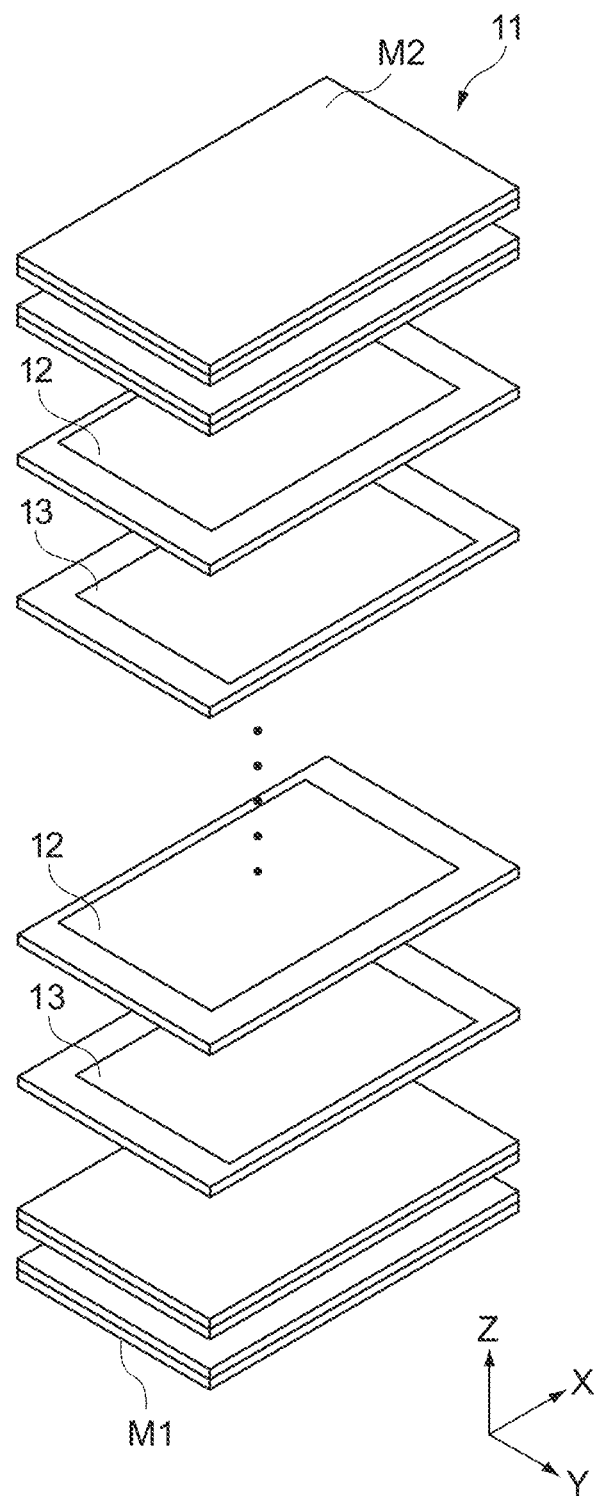
FIG. 12 is a perspective view showing a lamination state of an unsintered ceramic body in Step S01.

In Step S01, an unsintered ceramic body 11 is produced. As shown in FIG. 12, the unsintered ceramic body 11 is obtained by laminating a plurality of ceramic sheets in the Z-axis direction by thermocompression bonding. An electrically conductive paste having a predetermined pattern is printed in advance on each ceramic sheet, and thus the first and second internal electrodes 12 and 13 can be disposed.

As shown in FIG. 12, the first and second internal electrodes 12 and 13 are patterned so as to be spaced from the side surfaces facing in the X-axis direction and the end surfaces facing in the Y-axis direction. Accordingly, in the ceramic body 11 obtained in the Step S01, the first and second internal electrodes 12 and 13 are wrapped by the dielectric ceramics and are not exposed on the outer surface.

4.2 Step S02: Sintering

In Step S02, the ceramic body 11 obtained in Step S01 is sintered. By Step S02, the dielectric ceramics and the first and second internal electrodes 12 and 13 that constitute the ceramic body 11 are sintered. Step S02 can include, for example, a plurality of heat treatment processes such as a debinder process, this sintering process, and a reoxidation process.

In the debinder process, an organic constituent such as a binder contained in the unsintered ceramic body 11 is removed. In this sintering process, the ceramic body 11 is sintered. In the reoxidation process, the ceramic body 11 is subjected to heat treatment in an oxidizing atmosphere, to compensate for the lack of oxygen in the ceramic body 11 after the sintering process.

In Step S02, if the first and second internal electrodes 12 and 13 are exposed on the outer surface of the ceramic body 11, the first and second internal electrodes 12 and 13 are oxidized particularly in the reoxidation process. However, in Step S02 according to this embodiment, the first and second internal electrodes 12 and 13 are not exposed on outer surface of the ceramic body 11, and can thus be inhibited from being oxidized.

Thus, in Step S02 according to this embodiment, conditions of the respective heat treatment processes for the ceramic body 11 can be determined so as to obtain high physical property without considering the oxidation of the first and second internal electrodes 12 and 13. Thus, the physical property of the ceramic body 11, such as a dielectric constant of the dielectric ceramics, can be sufficiently enhanced.

4.3 Step S03: Formation of Penetrating Hole

In Step S03, the first and second penetrating holes 19 and 20 shown in FIGS. 1, 4, and 5 are formed in the ceramic body 11 sintered in Step S02. In Step S03, the first main surface M1 of the ceramic body 11 is irradiated with short-pulse laser light. Examples of the short-pulse laser light to be used include pico-second laser light and femto-second laser light.

Using the short-pulse laser light allows the first and second penetrating holes 19 and 20 to be formed by ablation processing in which the dielectric ceramics and the first and second internal electrodes 12 and 13 that constitute the ceramic body 11 are not melted but sublimated. Therefore, the ceramic body 11 can be processed to have a more accurate shape while suppressing the influence of the heat applied to the ceramic body 11.

In Step S03, the ceramic body 11 is irradiated with the short-pulse laser light from the first main surface M1 side, and the first and second penetrating holes 19 and 20 respectively having the tapered surfaces 19a and 20a that are narrowed from the first main surface M1 toward the second main surface M2 can be formed. For the processing method using the short-pulse laser light, a percussion boring method, a trepanning method, or the like can be employed.

Figure 13:
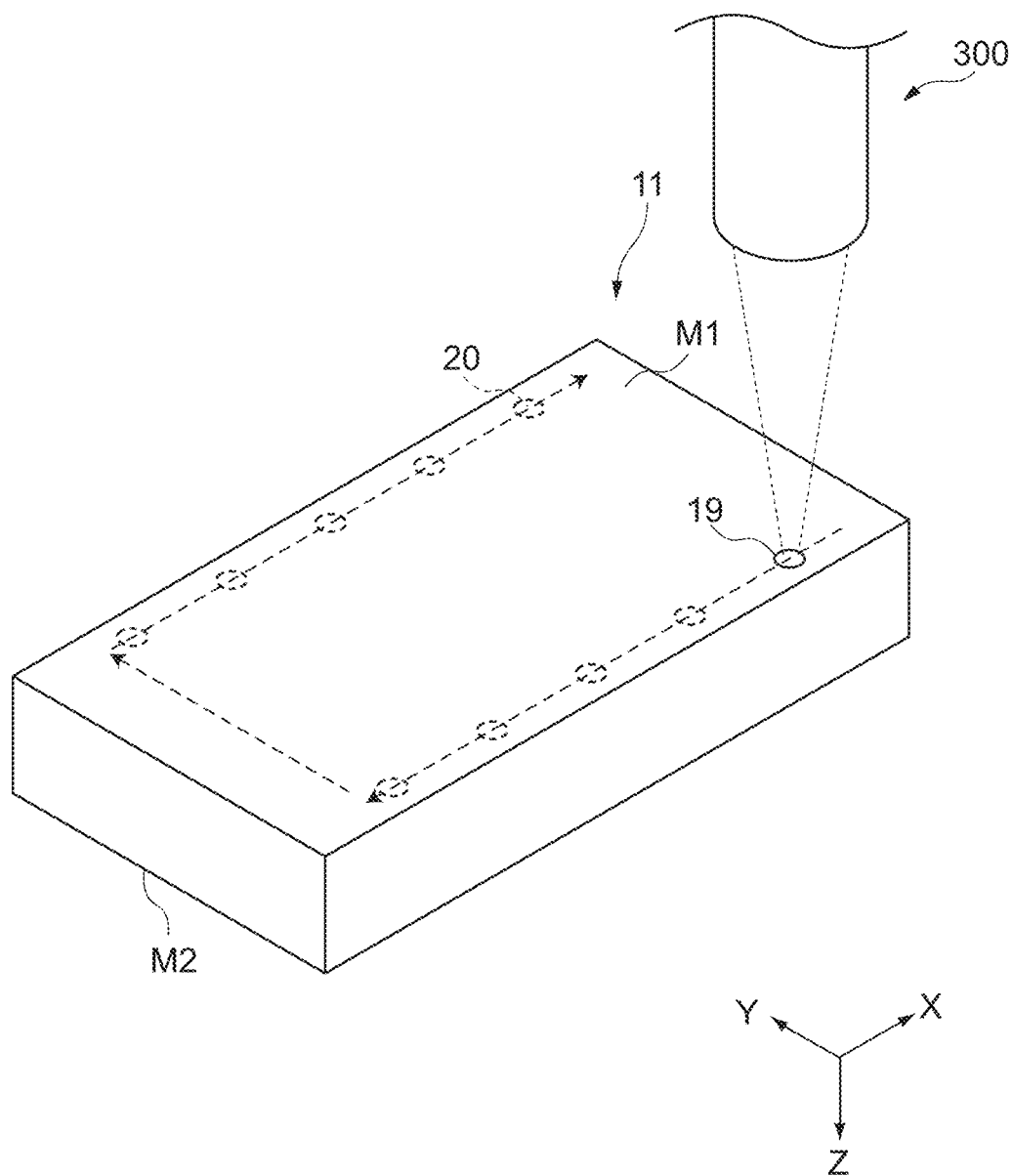
FIG. 13 is a perspective view of the ceramic body in Step S03.

FIG. 13 shows a method of forming the first and second penetrating holes 19 and 20 by using a laser irradiation device 300 capable of emitting the short-pulse laser light. As indicated by the dashed arrow in FIG. 13, the laser irradiation device 300 is sequentially moved in the X- and Y-axis directions, and thus all of the first and second penetrating holes 19 and 20 can be formed in the ceramic body 11.

In Step S03, the first and second penetrating holes 19 and 20 are collectively formed in the ceramic body 11 including the ceramic sheets laminated in advance in Step S01. Thus, in contrast to the configuration in which the first and second penetrating holes 19 and 20 are formed in each of the ceramic sheets before lamination, the displacement in position of the first and second penetrating holes 19 and 20 between the ceramic sheets does not occur.

Therefore, in Step S03, irrespective of the accuracy of the positions to which the short-pulse laser light is emitted, the first and second penetrating holes 19 and 20 penetrating in the Z-axis direction are obtained. Thus, the diameters of the first and second penetrating holes 19 and 20 formed in the ceramic body 11 can be made small. Accordingly, the degree of freedom in design of the multi-layer ceramic capacitor 10 is improved.

Further, in Step S03, the first and second penetrating holes 19 and 20 are formed in the ceramic body 11 sintered in Step S02. Thus, the first and second penetrating holes 19 and 20 can be processed into a more accurate shape than the configuration in which the first and second penetrating holes 19 and 20 are formed in the unsintered ceramic body 11 that is soft and deformable. Thus, the first and second penetrating holes 19 and 20 each having a small diameter are easily formed.

From the above description, the diameter of each of the first and second penetrating holes 19 and 20 in the first main surface M1 of the ceramic body 11 can be set to 30 μm or less, 20 μm or less, or further 10 μm or less, for example. Further, the diameter of each of the first and second penetrating holes 19 and 20 in the first main surface M1 can be set to 5 μm or more. Furthermore, the diameter of each of the first and second penetrating holes 19 and 20 in the first main surface M1 is favorably 5 μm or more and 30 μm or less, more favorably 5 μm or more and 20 μm or less, and still more favorably 5 μm or more and 10 μm or less in terms of the fluidity of solder. In addition, the intervals of the first and second penetrating holes 19 and 20 in the X-axis direction can be set to, for example, approximately 100 μm.

4.4 Step S04: Formation of External Electrode

In Step S04, the first external electrode 14 and the second external electrode 15 are formed on the ceramic body 11 including the first and second penetrating holes 19 and 20 formed in Step S03, so that the multi-layer ceramic capacitor 10 shown in FIGS. 1 to 5 is produced. The first and second external electrodes 14 and 15 can be formed by, for example, performing sputtering on the ceramic body 11 from the first main surface M1 side.

When sputtering is performed from the first main surface M1 side, the second conductive layers 14b and 15b are formed on the first main surface M1 of the ceramic body 11. Further, the first conductive layers 14a and 15a are respectively formed on the tapered surfaces 19a and 20a, which face the first main surface M1 side, by metal atoms entering the first and second penetrating holes 19 and 20.

Accordingly, the first and second external electrodes 14 and 15 each extending over the first main surface M1 and the tapered surfaces 19a and 20a are formed. It should be noted that the method of forming the first and second external electrodes 14 and 15 is not limited to sputtering and may be physical vapor deposition (PVD), chemical vapor deposition (CVD), atomic layer deposition (ALD), or the like. Further, the first and second external electrodes 14 and 15 may be formed by using a dry process such as sputtering and a wet process such as wet plating in combination.

5. Other Embodiments

While the embodiment of the present disclosure has been described, the present disclosure is not limited to the embodiment described above, and it should be appreciated that the present disclosure may be variously modified as a matter of course.

For example, in the embodiment described above, the multi-layer ceramic capacitor 10 has been described as an example of a multi-layer ceramic electronic component, but the present disclosure can be applied to general multi-layer ceramic electronic components each including external electrodes. Examples of such multi-layer ceramic electronic components include a chip varistor, a chip thermistor, and a multi-layer inductor.

What is claimed is:

1. A multi-layer ceramic electronic component, comprising:
    a ceramic body including
        a first main surface and a second main surface that face in a first direction,
        first internal electrodes and second internal electrodes laminated in the first direction, and
        a first penetrating hole that penetrates through an entirety of the ceramic body from the first main surface to the second main surface, the first penetrating hole having a diameter that decreases from the first main surface toward the second main surface and including a first tapered surface, and
        a second penetrating hole that penetrates through an entirety of the ceramic body from the first main surface to the second main surface, the second penetrating hole having a diameter that decreases from the first main surface toward the second main surface and including a second tapered surface; and
    an external electrode including
        a first conductive layer disposed along the first tapered surface and the second tapered surface, wherein the first conductive layer does not close the first penetrating hole and does not close the second penetrating hole, and
        a second conductive layer disposed along the first main surface and connected to the first conductive layer,
    wherein the external electrode includes a first external electrode connected to the first internal electrodes and a second external electrode connected to the second internal electrodes, a polarity of the first external electrode being different from a polarity of the second external electrode,
    wherein the first penetrating hole is disposed on a first end portion of the ceramic body and the second penetrating hole is disposed on a second end portion of the ceramic body opposite from the first end portion in a second direction orthogonal to the first direction,
    wherein the first penetrating hole is open and is not closed by any structure, and
    wherein the second penetrating hole is open and is not closed by any structure.

2. The multi-layer ceramic electronic component according to claim 1, wherein the ceramic body has a dimension in the first direction that is 200 μm or less.

3. The multi-layer ceramic electronic component according to claim 1, wherein
    the ceramic body has a dimension in the second direction, and has a dimension in a third direction orthogonal to the first direction and the second direction, the dimension in the third direction being smaller than the dimension in the second direction, and
    the first external electrode and the second external electrode are provided to both end portions in the second direction.

4. A circuit board, comprising:
    the multi-layer ceramic electronic component according to claim 1; and
    a wiring board that faces the first main surface, the external electrode being bonded to the wiring board by solder.

5. The circuit board according to claim 4, wherein the solder enters the first penetrating hole and the second penetrating hole.

6. The multi-layer ceramic electronic component according to claim 1, wherein a diameter of each of the first penetrating hole and the second penetrating hole in the first surface is 30 μm or less, being larger than a diameter of each of the first penetrating hole and the second penetrating hole in the second main surface.

7. The multi-layer ceramic electronic component according to claim 1, wherein a diameter of each of the first penetrating hole and the second penetrating hole in the first surface is 10 μm or less, being larger than a diameter of each of the first penetrating hole and the second penetrating hole in the second main surface.

8. A multi-layer ceramic electronic component, comprising:
   a ceramic body including
      a first main surface and a second main surface that face in a first direction,
      internal electrodes laminated in the first direction, and
      a penetrating hole that has a diameter decreasing from the first main surface toward the second main surface and includes a tapered surface, the internal electrodes being exposed on the tapered surface; and
   an external electrode including
      a first conductive layer disposed along the tapered surface, wherein the first conductive layer does not close the penetrating hole, and
      a second conductive layer disposed along the first main surface and connected to the first conductive layer,
   wherein the external electrode includes a first external electrode and a second external electrode, a polarity of the first external electrode being different from a polarity of the second external electrode,
   wherein the external electrode further includes a third conductive layer that extends along the second main surface from the first conductive layer, and
   wherein the penetrating hole is open and is not closed by any structure.

9. A multi-layer ceramic electronic component, comprising:
   a ceramic body including
      a first main surface and a second main surface that face in a first direction,
      first and second internal electrodes laminated in the first direction, and
      a penetrating hole that has a diameter decreasing from the first main surface toward the second main surface and includes a tapered surface; and
   an external electrode including
      a first conductive layer disposed along the tapered surface, wherein the first conductive layer does not close the penetrating hole, and
      a second conductive layer disposed along the first main surface and connected to the first conductive layer,
   wherein the external electrode includes a first external electrode connected to the first internal electrodes and a second external electrode connected to the second internal electrodes, a polarity of the first external electrode being different from a polarity of the second external electrode, and
   wherein the external electrode further includes a third conductive layer that extends along the second main surface from the first conductive layer, and
   wherein the penetrating hole is open and is not closed by any structure.

10. The multi-layer ceramic electronic component according to claim 9, wherein
   the penetrating hole includes a plurality of penetrating holes provided to each of the first external electrode and the second external electrode.

11. The multi-layer ceramic electronic component according to claim 9, wherein
   the ceramic body has a dimension in the first direction that is 200 μm or less.

12. The multi-layer ceramic electronic component according to claim 9, wherein
   the ceramic body has a dimension in a second direction orthogonal to the first direction, and has a dimension in a third direction orthogonal to the first direction and the second direction, the dimension in the third direction being smaller than the dimension in the second direction, and
   the first external electrode and the second external electrode are provided to both end portions in the second direction.

13. A circuit board, comprising:
   the multi-layer ceramic electronic component according to claim 9; and
   a wiring board that faces the first main surface, the external electrode being bonded to the wiring board by solder.

14. The circuit board according to claim 13, wherein the solder enters the penetrating hole.

15. The multi-layer ceramic electronic component according to claim 9, wherein a diameter of the penetrating hole in the first surface is 30 μm or less, being larger than a diameter of the penetrating hole in the second main surface.

16. The multi-layer ceramic electronic component according to claim 9, wherein a diameter of the penetrating hole in the first surface is 10 μm or less, being larger than a diameter of the penetrating hole in the second main surface.

* * * * *